United States Patent [19]

Sato et al.

[11] Patent Number: 5,456,765
[45] Date of Patent: Oct. 10, 1995

[54] EPITAXIAL WAFER OF GALLIUM ARSENIDE PHOSPHIDE

[75] Inventors: Tadashige Sato; Hisanori Fujita, both of Ushiku, Japan

[73] Assignee: Mitsubishi Kasei Corporation, Tokyo, Japan

[21] Appl. No.: 72,577

[22] Filed: Jun. 7, 1993

[30] Foreign Application Priority Data

Jun. 9, 1992 [JP] Japan .................................. 4-149726

[51] Int. Cl.⁶ ........................................... H01L 33/00
[52] U.S. Cl. .................. 148/33; 148/33.4; 148/DIG. 97; 437/127; 437/976
[58] Field of Search ............................. 148/33, 33.1, 33.4, 148/33.5, DIG. 97, DIG. 99; 437/133, 129, 127, 54, 976, 905; 117/50

[56] References Cited

U.S. PATENT DOCUMENTS

| | | | |
|---|---|---|---|
| 4,252,576 | 2/1981 | Hasegawa et al. | 148/33.4 |
| 4,378,259 | 3/1983 | Hasegawa et al. | 437/976 |
| 4,789,421 | 12/1988 | Umeno et al. | 148/33.5 |
| 4,865,655 | 9/1989 | Fujita et al. | 148/33.4 |
| 4,968,642 | 11/1990 | Fujita et al. | 437/128 |
| 5,057,442 | 10/1991 | Haluka | 437/127 |

FOREIGN PATENT DOCUMENTS

| | | | |
|---|---|---|---|
| 9215163019 | 5/1990 | Germany | 148/33.4 |
| 8718339726 | 8/1979 | Japan | 148/33.5 |
| 3201575 | 3/1991 | Japan . | |

Primary Examiner—Olik Chaudhuri
Assistant Examiner—S. Mulpuri
Attorney, Agent, or Firm—Armstrong, Westerman, Hattori, McLeland & Naughton

[57] ABSTRACT

A mixed crystal ratio difference is introduced in a gallium arsenide phosphide mixed crystal layer having a desired constant mixed crystal ratio, thereby reducing the amount of stress remaining within the resulting epitaxial wafer. This is less likely or unlikely to crack, and so can be well used for LED fabrication.

5 Claims, 1 Drawing Sheet

EPITAXIAL WAFER OF GALLIUM ARSENIDE PHOSPHIDE

BACKGROUND OF THE INVENTION

The present invention relates to an epitaxial wafer of gallium arsenide phosphide that is prevented or inhibited from cracking due to internal stress. In the present disclosure, it is understood that the gallium arsenide phosphide is represented by $GaAs_{1-x}P_x$ where x is a mixed crystal ratio greater than 1 but less than 0.5.

Epitaxial wafers of gallium arsenide phosphide—that are obtained by forming a mixed crystal layer of gallium arsenide phosphide on a gallium phosphide substrate by epitaxial growth technologies—have primary application in the fabrication of LEDs (light emitting diodes) that emit visible light lying in the red to yellowish green range.

A serious problem associated with such epitaxial wafers is that, because the substrates and epitaxial layers have varying crystal lattice constants, they are distorted due to a crystal lattice constant difference, so giving rise to some defects such as increased dislocation and cracking, and this is particularly true of when a desired mixed crystal layer of gallium arsenide phosphide is formed directly on a gallium phosphide single crystal substrate.

So far, this distortion has been relieved by forming on the gallium phosphide single crystal substrate a layer with the mixed crystal ratio, x, varying from 1 to a desired value, and then forming on that layer a layer having a desired constant mixed crystal ratio.

This method gives a prima facie satisfactory epitaxial wafer, but the resultant wafer is now found to be apt to bend. In order to prevent the bending of the wafer, the applicant has already proposed to define the "overshoot" of the mixed crystal ratio, as set forth in JP-A-3-201575.

Even with this technique for preventing the bending of the wafer by defining such "overshoot", it is unavoidable for stress to remain within the epitaxial wafer, and this is responsible for wafer cracking. The use of an easy-to-crack wafer thus offers a problem that the productivity of LEDs drops.

This is partly because there is a difference in the lattice constant between the substrate and the gallium arsenide phosphide mixed crystal, and particularly because of a difference in the coefficient of thermal expansion between them; that is, the epitaxial wafer is distorted, while it is cooled down to normal temperature upon being subjected to vapor phase epitaxial growth at a high temperature from 600° C. to 1,000° C., so that stress can remain within the epitaxial wafer.

In view of the problems mentioned above, a primary objective of the invention is to provide an epitaxial wafer of gallium arsenide phosphide which is less likely or unlikely to crack during the process of fabricating LEDs.

SUMMARY OF THE INVENTION

According to the invention, the objective mentioned above is achieved by the provision of an epitaxial wafer of gallium arsenide phosphide that is obtained by forming on a gallium phosphide single crystal substrate a first gallium arsenide phosphide mixed crystal layer having a varying mixed crystal ratio and a second gallium arsenide phosphide mixed crystal layer having a constant mixed crystal ratio in this order, wherein:

a mixed crystal ratio difference is introduced in the second gallium arsenide phosphide mixed crystal layer having a constant mixed crystal ratio, whereby the mixed crystal ratio of the side of said mixed crystal layer opposite to the substrate becomes lower than that of the surface side thereof by 0.01 to 0.05.

BRIEF DESCRIPTION OF THE DRAWINGS

The above and other objectives and features of the invention will be appreciated as the same becomes better understood by reference to the following detailed description of a presently preferable embodiment when considered in connection with the accompanying drawings, in which.

DESCRIPTION

Figure 1:
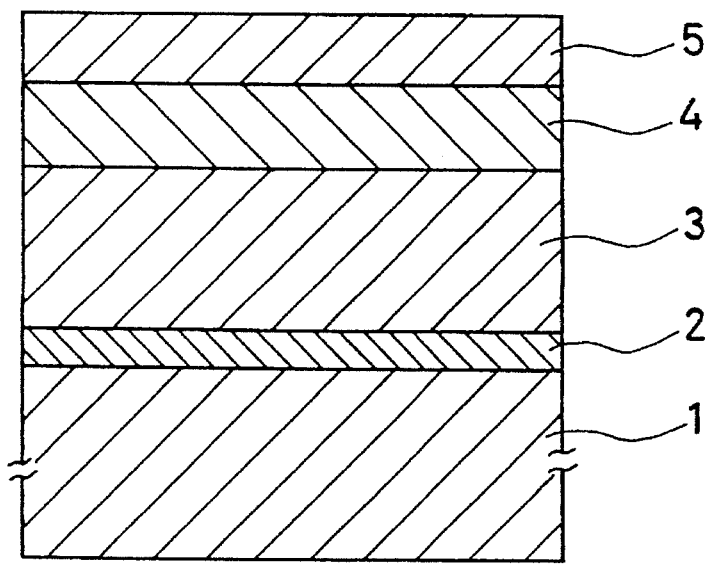
FIG. 1 is a schematic illustration of a longitudinal section of one embodiment of the epitaxial wafer according to the invention.

Referring now to FIG. 1, there is shown a single crystal substrate 1, for which a gallium phosphide single crystal substrate is suitable, because the light radiating from an LED is less absorbed by it. Preferably, the crystallographic surface orientation of the substrate is along the {100} plane or at an angle of 2 to 10° in the <110> direction with respect to the {100} plane.

Reference numeral 2 stands for an epitaxial layer of gallium phosphide which, albeit not essentially required, can eliminate an influence of crystallizability on the gallium arsenide phosphide mixed crystal substrate. In other words, the presence of the epitaxial layer enables the grown gallium arsenide phosphide mixed crystal layer to be of good.

Reference numeral 3 represents a first gallium arsenide phosphide mixed crystal layer having a varying mixed crystal ratio. The layer 3 has a mixed crystal ratio, x, that varies continuously from 1, indicating pure gallium phosphide, to a desired value, and is provided so as to relieve stress occurring due to a lattice constant difference between the gallium phosphide single crystal substrate 1 and a gallium arsenide phosphide mixed crystal layer 4 having a constant mixed crystal ratio—this will be described just below—, thereby averting dislocation, etc.

Reference numerals 4 and 5 each denote a gallium arsenide phosphide mixed crystal layer having a constant mixed crystal ratio, with the mixed crystal ratio, x, selected from the range of greater than 1 to less than 0.5. A gallium arsenide phosphide mixed crystal layer, the x of which is less than 0.5, is unpreferable, because a lattice constant difference between it and the gallium phosphide used for the substrate becomes too large.

The gallium arsenide phosphide mixed crystal layer 5 is provided to make a mixed crystal ratio difference with respect to the gallium arsenide phosphide mixed crystal layer 4. Incorporated in it is a PN junction. Notice that the gallium arsenide phosphide used in the invention, because of being of the so-called indirect transition type, may be doped with nitrogen as isoelectronic impurities, thereby improving the quantum efficiency.

Preferably, the mixed crystal ratio difference is determined such that the mixed crystal ratio of the layer 5 becomes smaller than that of the layer 4.

Preferably, the mixed crystal ratio difference lies in the range of 0.01 to 0.05. A difference exceeding 0.05 is unpreferable, because the warping of the substrate becomes large. A difference less than 0.01 is again unpreferable, because strain remains within the resulting wafer, so that it has a large risk of cracking during the process of LED fabrication.

The mixed crystal ratio gradient across the interface between the layers 4 and 5 should be preferably not more than 10 μm and more preferably at most 5 μm, each in terms of thickness, and should most preferably be varied stepwise.

The gallium arsenide phosphide mixed crystal layers are preferably grown by vapor phase growth technologies inclusive of halogen delivery, metallo-organic chemical vapor deposition (MOCVD) and molecular beam epitaxial growth.

Mixed crystal ratio control may be achieved by regulating the amount of phosphorous and/or arsenic fed for expitaxial growth by vapor phase growth technologies.

EXAMPLES

The invention will now be explained, more specifically but not exclusively, with reference to the following examples.

Example 1

Preparation of Epitaxial Wafer of $GaAs_{0.45}P_{0.55}$

A single crystal substrate of gallium phosphide doped with sulfur at $4 \times 10^{10}/cm^{-3}$ was used for the substrate to be placed in a horizontal epitaxial reactor. This substrate was 50 mm in diameter, with the surface orientation displaced at an angle of 6° in the <110> direction with respect to the {100} plane.

A quartz boat containing high-purity gallium was located at a predetermined position within the reactor.

Argon gas was admitted in the reactor for the sufficient replacement of the air. Then, hydrogen was introduced as carrier gas at a flow rate of 3,000 ml/minute in the reactor, while argon gas feed was stopped, following by the beginning of heating.

Upon making certain that the temperatures of the portions on which the substrate and quartz boat were located reached 930° C. and 830° C., respectively, vapor phase growth gas was introduced in the reactor in the following manner, thereby initiating the vapor phase epitaxial growth of the gallium phosphide layer (shown at 2 in FIG. 1).

As N-type impurities, hydrogen containing 10 ppm of hydrogen sulfide was fed in the reactor at a flow rate of 6.2 ml/minute.

High-purity hydrogen chloride gas was introduced at a flow rate of 91 ml/minute in the zone of the reactor in which the gallium containing boat was incorporated.

Hydrogen containing 10% of phosphine ($PH_3$) was fed in the reactor at a flow rate of 166 ml/minute.

The gallium phosphide layer was grown for 10 minutes. After this, the growth of the gallium arsenide phosphide layer having a varying mixed crystal ratio (shown at 3 in FIG. 1) was initiated.

That is, while the portion of the reactor with the substrate placed on it was cooled from 930° C. down to 850° C. at a cooling rate of 1.3° C./minute, hydrogen containing 10% of arsine ($ASH_3$) at a flow rate increasing constantly from 0 ml/minute to 122 ml/minute. Other conditions remained unchanged.

Subsequently, while the flow rate of arsine and the temperature of the portion of the reactor with the substrate placed on it were kept constant, the layer (shown at 4 in FIG. 1) having a constant mixed crystal ratio was grown for 15 minutes.

Then, the flow rate of arsine was varied from 122 ml/minute to 136 ml/minute for two minutes to make a mixed crystal ratio difference. After this, the layer (shown at 5 in FIG. 1) having a constant mixed crystal ratio was grown under the same conditions. For the last 60 minutes during the growth of the layer 5, high-purity ammonia gas was introduced in the reactor at a flow rate of 239 ml/minute so as to achieve nitrogen doping as an isoelectronic trap.

The thus obtained epitaxial wafer is found to have a well-smoothened surface, and the layer 5 is found to have a carrier concentration of $1.2 \times 10^{16}$ cm$^{-3}$.

LED PREPARATION

An LED was prepared, using the epitaxial wafer mentioned above.

For LED fabrication, the epitaxial wafer was polished on the back or substrate side, followed by the diffusion of P-type of impurities, i.e., zinc. Subsequently, electrode-forming, dicing, wire-bonding and other steps were performed to make a 500-μm$^2$ LED chip.

This LED is found to have a peak emission wavelength of 650 nm±2.0 nm and a luminance of 5,130 FiL (at a current density of 20 A/cm$^2$.

Examples 2–3 & Comparative Examples 1–4

Epitaxial wafers of $GaAs_{0.45}P_{0.55}$ were prepared following Example 1 with the exception of the conditions set out in Table 1.

TABLE 1

| | Arsine Feed, ml/minute | | | | | | |
|---|---|---|---|---|---|---|---|
| | Examples | | | Comparative Examples | | | |
| Layer | 1 | 2 | 3 | 1 | 2 | 3 | 4 |
| 2 | 0 | 0 | 0 | 0 | 0 | 0 | 0 |
| 3 | 0→122 | 0→128 | 0→117 | 0→150 | 0→107 | 0→136 | 0→159 |
| 4 | 122 | 128 | 117 | 150 | 107 | 136 | 159 |
| 5 | 136 | 136 | 136 | 136 | 136 | 136 | 136 |

Notice that "→" indicates that the flow rate varies continuously.

The carrier concentrations of the epitaxial wafers obtained in the examples and comparative examples are shown in Table 2 together with the thickness of the respective layers and the mixed crystal ratio difference.

TABLE 2

| | Layer Thickness, | | | | Mixed Crystal Ratio | | |
|---|---|---|---|---|---|---|---|
| | μm | | | | | | Ratio |
| | 2 | 3 | 4 | 5 | 4 | 5 | Difference |
| Ex. | | | | | | | |
| 1 | 3.1 | 17.6 | 6.1 | 30.0 | 0.591 | 0.565 | +0.026 |
| 2 | 3.1 | 18.0 | 6.3 | 29.9 | 0.580 | 0.565 | +0.015 |
| 3 | 3.4 | 17.4 | 6.0 | 30.0 | 0.602 | 0.566 | +0.036 |
| Comp. Ex. | | | | | | | |
| 1 | 3.2 | 19.4 | 6.7 | 30.1 | 0.540 | 0.564 | −0.024 |
| 2 | 3.2 | 16.7 | 5.9 | 29.9 | 0.623 | 0.566 | +0.057 |

TABLE 2-continued

| | Layer Thickness, μm | | | | Mixed Crystal Ratio | | |
|---|---|---|---|---|---|---|---|
| | 2 | 3 | 4 | 5 | 4 | 5 | Ratio Difference |
| 3 | 3.2 | 18.5 | 6.4 | 30.0 | 0.563 | 0.564 | −0.001 |
| 4 | 3.2 | 20.0 | 6.9 | 29.9 | 0.525 | 0.565 | −0.040 |

Notice that the ratio difference is found by subtracting the mixed crystal ratio of the layer 5 from that of the layer 4.

Figure 2:
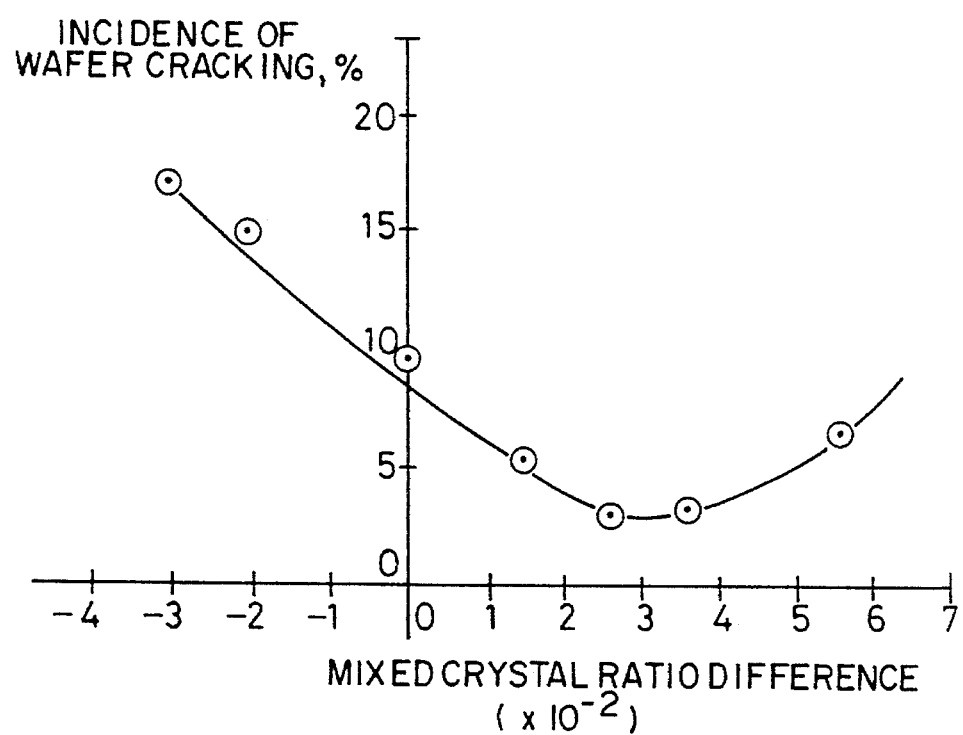
FIG. 2 represents the relation between the incidence of wafer cracking during the process of LED fabrication and the mixed crystal ratio difference.

The incidence of wafer cracking during the process of LED fabrication is shown in Table 3, and plotted in FIG. 2. The incidence of wafer cracking was found on the basis of 100 epitaxial wafers obtained in each of the examples of the invention and the comparative examples.

TABLE 3

| | Examples | | | Comparative Examples | | | |
|---|---|---|---|---|---|---|---|
| | 1 | 2 | 3 | 1 | 2 | 3 | 4 |
| Incidence of Cracking, % | 3.0 | 5.6 | 3.3 | 15 | 6.7 | 9.0 | 17 |

FIG. 2 illustrates the incidence of wafer cracking during the process of LED fabrication vs. the mixed crystal ratio difference, with the former as ordinate and the latter as abscissa, and indicates that the epitaxial wafers of the invention show an incidence of cracking that is no more than 6%.

The epitaxial wafers according to the invention are of great industrial value, because, in spite of the fact that they include on the substrates gallium arsenide phosphide mixed crystal layers that are different from the substrates in terms of the lattice constant and coefficient of thermal expansion, their cracking during the process of LED fabrication can be greatly reduced or inhibited, because of their reduced internal stress.

What is claimed is:

1. An epitaxial wafer of gallium arsenide phosphide that is obtained by forming on a gallium phosphide single crystal substrate a first gallium arsenide phosphide mixed crystal layer having a varying mixed crystal ratio and a second gallium arsenide phosphide mixed crystal layer having a constant mixed crystal ratio in this order, wherein:

a mixed crystal ratio difference is introduced in the second gallium arsenide phosphide mixed crystal layer having a constant mixed crystal ratio, whereby the mixed crystal ratio of the face of said second mixed crystal layer opposite to the substrate becomes lower than that of the surface face thereof by 0.01 to 0.05.

2. An epitaxial wafer as claimed in claim 1, wherein the crystallographic surface orientation of the substrate is along the {100} plane.

3. An epitaxial wafer as claimed in claim 1, wherein the crystallographic surface orientation of the substrate is at an angle of 2 to 10° in the <110> direction with respect to the {100} plane.

4. An epitaxial wafer as claimed in claim 1, wherein the second mixed crystal layer consists of two sub-layers, with one having a mixed crystal ratio smaller than that of the other.

5. An epitaxial wafer as claimed in claim 1, wherein the second mixed crystal layer is obtained by a vapor phase epitaxial growth process.

* * * * *